United States Patent
Tseng

(10) Patent No.: US 10,019,930 B2
(45) Date of Patent: Jul. 10, 2018

(54) SHIFT REGISTER UNIT, GATE DRIVER CIRCUIT AND DISPLAY PANEL

(71) Applicant: EVERDISPLAY OPTRONICS (SHANGHAI) LIMITED, Shanghai (CN)

(72) Inventor: Ying-Hsiang Tseng, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 135 days.

(21) Appl. No.: 15/152,811

(22) Filed: May 12, 2016

(65) Prior Publication Data

US 2017/0124936 A1    May 4, 2017

(30) Foreign Application Priority Data

Nov. 4, 2015  (CN) .......................... 2015 1 0740346

(51) Int. Cl.
| | |
|---|---|
| *G11C 19/00* | (2006.01) |
| *G09G 3/20* | (2006.01) |
| *G11C 19/28* | (2006.01) |
| *G09G 3/3266* | (2016.01) |
| *G11C 19/18* | (2006.01) |
| *G09G 3/36* | (2006.01) |

(52) U.S. Cl.
CPC ......... *G09G 3/2092* (2013.01); *G09G 3/3266* (2013.01); *G11C 19/184* (2013.01); *G11C 19/28* (2013.01); *G09G 3/3677* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 6,426,743 | B1 * | 7/2002 | Yeo ...................... | G09G 3/3677 345/100 |
| 8,019,039 | B1 * | 9/2011 | Tsai ...................... | G11C 19/28 377/64 |
| 8,774,346 | B2 * | 7/2014 | Son ......................... | G09G 3/20 377/64 |
| 9,201,445 | B2 * | 12/2015 | Li .......................... | G11C 19/184 |
| 2006/0146978 | A1 * | 7/2006 | Jang ..................... | G09G 3/3677 377/64 |
| 2007/0040771 | A1 * | 2/2007 | Chung .................. | G11C 19/00 345/76 |
| 2014/0119491 | A1 * | 5/2014 | Liu ........................ | G11C 19/28 377/64 |

(Continued)

*Primary Examiner* — Tuan T Lam
(74) *Attorney, Agent, or Firm* — Yunling Ren

(57) ABSTRACT

The present disclosure relates to a shift register, a gate driver circuit and a display panel. The shift register includes first to eighth transistors and first and second capacitors. In the exemplary embodiments of the present disclosure, a shift register unit is composed of a relatively small number of transistors and capacitors, and thus the wiring areas occupied by the shift register unit and the gate driver circuit composed of a plurality of the shift register units can be reduced, thereby providing technical support for designing display panels with higher resolution and narrower bezel. Meanwhile, because the shift register unit and the gate driver circuit have a relatively simple structure, the manufacturing processes can be simplified and thereby costs can be reduced.

20 Claims, 11 Drawing Sheets

(56) References Cited

U.S. PATENT DOCUMENTS

| | | | |
|---|---|---|---|
| 2016/0125847 A1* | 5/2016 | Gu | G09G 3/3677 |
| | | | 345/205 |
| 2016/0189796 A1* | 6/2016 | Wu | G11C 19/28 |
| | | | 345/211 |
| 2016/0217870 A1* | 7/2016 | Tseng | G11C 19/28 |
| 2016/0225341 A1* | 8/2016 | Ma | G09G 3/20 |
| 2017/0193961 A1* | 7/2017 | Wang | G09G 5/003 |
| 2017/0221578 A1* | 8/2017 | Xiao | G11C 17/18 |

* cited by examiner

SHIFT REGISTER UNIT, GATE DRIVER CIRCUIT AND DISPLAY PANEL

CROSS-REFERENCE TO RELATED APPLICATIONS

This application claims priority to Chinese Patent Application No. 201510740346.X, filed Nov. 4, 2015, the entire contents of which are incorporated herein by reference.

TECHNICAL FIELD

The present disclosure generally relates to display technologies, and more particularly to a shift register unit, a gate driver circuit including the shift register unit and a display panel including the gate driver circuit.

BACKGROUND

As compared with conventional Liquid Crystal Display (LCD) panels, Organic Light Emitting Diode (OLED) panels have advantages such as fast response speed, good color purity and brightness, high contrast ratio and wide view angle, and thereby have drawn increasingly wide attention from manufactures. However, the OLED panels still have some problems which need to be solved.

OLED panels display images using a pixel matrix. Generally, rows of pixels are coupled to corresponding scan lines. During operation of an OLED panel, a gate driver circuit converts input signals into on/off control signals using shift register units and then applies the on/off control signals to the scan lines for respective rows of pixels on the OLED panel to turn on corresponding rows of pixels.

The shift register units generally include a relatively large number of transistors and need many clock signals for driving. With the development of flat panel display technologies, products with high resolution and narrow bezel have attracted more and more attention. However, the large number of transistors in the shift register units occupy a large wiring area, which is not benefit for increasing effective display area and narrow bezel design. Further, the large number of transistors result in more difficulties and thereby increased costs in manufacturing of shift resister units.

SUMMARY

Aiming at a part or whole of the problems in related arts, embodiments of the present disclosure provide a shift register unit, a gate driver circuit employing the shift register unit, and a display panel including the gate driver circuit which have simplified structure and are capable of reducing wiring area of the gate driver circuit.

Other properties and advantages of the present disclosure will become apparent from the following detailed description, or may be partially implemented by practice of the present disclosure.

According to a first aspect of embodiments of the present disclosure, there is provided a shift register unit, including:

a first switching element that is switched on in response to an input signal so as to provide the input signal to a first node;

a second switching element that is switched on in response to a first clock signal so as to provide a first voltage to the first node;

a third switching element that is switched on in response to the first clock signal so as to provide the first voltage to a second node;

a fourth switching element that is switched on in response to a third clock signal so as to provide the input signal to the second node;

a fifth switching element that is switched on in response to a signal at the second node so as to input the first voltage to a third node;

a sixth switching element that is switched on in response to the first clock signal so as to provide a second voltage to the third node;

a seventh switching element that is switched on in response to a signal at the third node so as to provide the first voltage to an output signal terminal;

an eighth switching element that is switched on in response to a signal at the first node so as to provide a second clock signal to the output signal terminal;

a first capacitor coupled between the first voltage and the second node; and a second capacitor coupled between the first node and the output signal terminal.

In an exemplary embodiment of the present disclosure, the first to eighth switching elements are first to eight transistors, respectively.

In an exemplary embodiment of the present disclosure, each of the first to eighth transistors has a first terminal, a second terminal and a control terminal;

the control terminal and the first terminal of the first transistor are coupled with the input signal, and the second terminal of the first transistor is coupled with the first node;

the control terminals of the second and third transistors are coupled with the first clock signal, the first terminals of the second and third transistors are coupled with the first voltage, the second terminal of the second transistor is coupled with the first node, and the second terminal of the third transistor is coupled with the second node;

the control terminal of the fourth transistor is coupled with the third clock signal, the first terminal of the fourth transistor is coupled with the input signal, and the second terminal of the fourth transistor is coupled with the second node;

the control terminal of the fifth transistor is coupled with the second node, the first terminal of the fifth transistor is coupled with the first voltage, and the second terminal of the fifth transistor is coupled with the third node;

the control terminal of the sixth transistor is coupled with the first clock signal, the first terminal of the sixth transistor is coupled with the second voltage, and the second terminal of the sixth transistor is coupled with the third node;

the control of the seventh transistor is coupled with the third node, the first terminal of the seventh transistor is coupled with the first voltage, and the second terminal is coupled with the output signal terminal; and the control terminal of the eighth transistor is coupled with the first node, the first terminal of the eight transistor is coupled with the second clock signal, and the second terminal of the eighth transistor is coupled with the output signal terminal.

In an exemplary embodiment of the present disclosure, the first to eighth transistors are N type transistors.

In an exemplary embodiment of the present disclosure, the first to eighth transistors are P type transistors.

In an exemplary embodiment of the present disclosure, the first clock signal is two thirds of a clock signal cycle ahead of the second clock signal in phase, and the second clock signal is two thirds of the clock signal cycle ahead of the third clock signal in phase.

In an exemplary embodiment of the present disclosure, the first to third clock signals have a duty cycle of 1:3 which is a ratio between duration of a low level and the period of each clock signal.

In an exemplary embodiment of the present disclosure, the first voltage is a high level, and the second voltage is a low level.

According to a second aspect of embodiments of the present disclosure, there is provided a gate driver circuit, including any one of the shift register unit as mentioned above.

In an exemplary embodiment of the present disclosure, the gate driver circuit comprises a plurality of the shift register units which are cascaded; except the last stage of shift register unit, an output signal of each stage of shift register unit is coupled with an input signal terminal of a next stage of shift register unit, and an input signal of the first stage of shift register is input with a starting signal.

In an exemplary embodiment of the present disclosure, the plurality of shift register units which are cascaded comprise at least a first shift register unit, a second shift register unit and a third shift register unit;

an output signal terminal of the first shift register unit is coupled with an input signal terminal of the second shift register unit; and an output signal terminal of the second shift register unit is coupled with an input signal terminal of the third shift register unit.

In an exemplary embodiment of the present disclosure, the gate driver circuit further includes:

a clock signal generation unit generating a first clock signal, a second clock signal and a third clock signal, wherein the first clock signal is two thirds of a clock signal cycle ahead of the second clock signal in phase, and the second clock signal is two thirds of the clock signal cycle ahead of the third clock signal in phase;

a first to third clock signals input to the first shift register unit are the first to third clock signals generated by the clock generation unit, respectively;

a first to third clock signals input to the second shift register unit are the third clock signal, the first clock signal and the second clock signal generated by the clock generation unit, respectively;

a first to third clock signals input to the third shift register unit are the second clock signal, the third clock signal and the first clock signal generated by the clock generation unit, respectively.

According to a third aspect of embodiments of the present disclosure, there is provided a display panel, including any one of the gate driver circuits as mentioned above.

In the exemplary embodiments as disclosed herein, a shift register unit is composed of a relatively small number of transistors and capacitors, and thus the wiring areas occupied by the shift register unit and the gate driver circuit composed of a plurality of the shift register units can be reduced, thereby providing technical support for designing display panels with higher resolution and narrower bezel. Meanwhile, because the shift register unit and the gate driver circuit have a relatively simple structure, the manufacturing processes can be simplified and thereby costs can be reduced.

BRIEF DESCRIPTION OF THE DRAWINGS

The above and other features and advantages of the present disclosure will become clearer from the description of exemplary embodiments with reference to drawings.

REFERENCE NUMBERS

S1 to S8: first to eighth switching elements
T1 to T8: first to eighth transistors
C1: first capacitor
C2: second capacitor
CK1: first clock signal
CK2: second clock signal
CK3: third clock signal
VDD: first voltage
VEE: second voltage
VIN: input signal (terminal)
VOUT: output signal terminal
N1: first node
N2: second node
N3: third node
SR1: first shift register unit
SR2: second shift register unit
SR3: third shift register unit
SR4: fourth shift register unit
SR5: fifth shift register unit

DETAILED DESCRIPTION

Now, exemplary implementations will be described more comprehensively with reference to the accompanying drawings. However, the exemplary implementations may be carried out in various manners, and shall not be interpreted as being limited to the implementations set forth herein; instead, providing these implementations will make the present disclosure more comprehensive and complete and will fully convey the conception of the exemplary implementations to the ordinary skills in this art. Throughout the drawings, the like reference numbers refer to the same or the like structures, and repeated descriptions will be omitted.

The features, structures or characteristics described herein may be combined in one or more embodiments in any suitable manner. In the following descriptions, many specific details are provided to facilitate sufficient understanding of the embodiments of the present disclosure. However, one of ordinary skills in this art will appreciate that the technical solutions in the present disclosure may be practiced without one or more of the specific details, or by employing other methods, components, materials and so on. In other conditions, well-known structures, materials or operations are not shown or described in detail so as to avoid confusion of respective aspects of the present disclosure.

Figure 1:
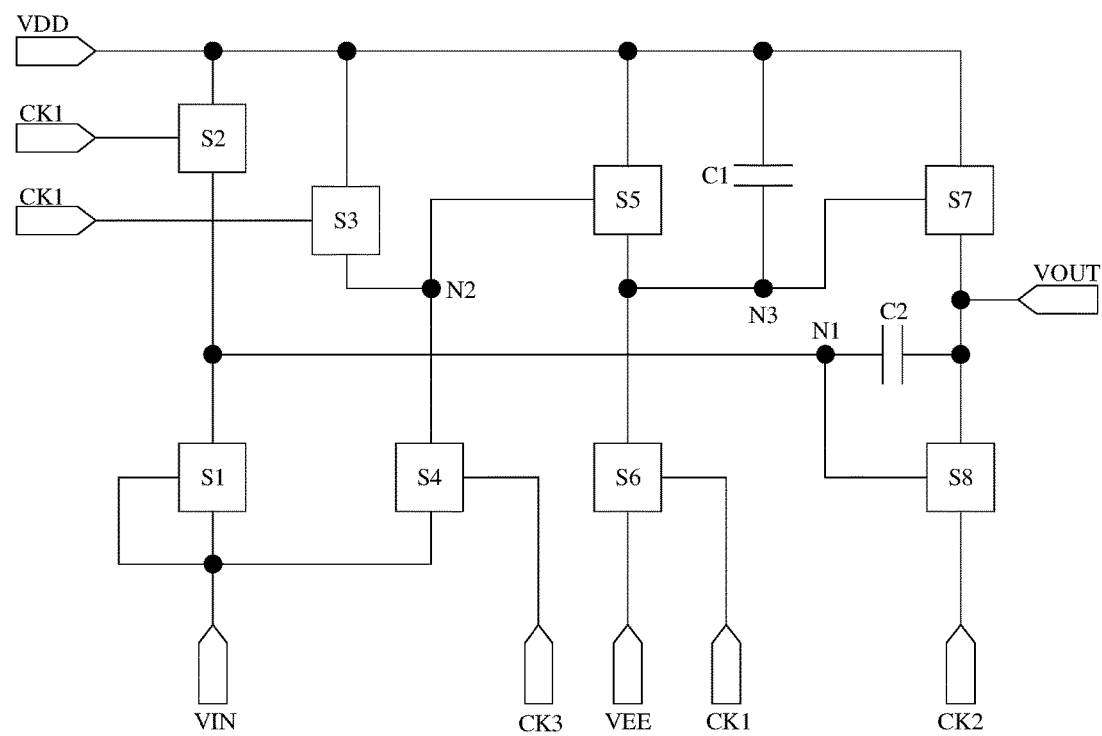
FIG. 1 is a schematic diagram showing a structure of a shift register unit according to an exemplary embodiment of the present disclosure.

FIG. 1 shows a shift register unit according to an exemplary embodiment of the present disclosure. The shift register unit includes a first switching element S1, a second switch element S2, a third switching element S3, a fourth switching element S4, a fifth switching element S5, a sixth switching element S6, a seven switching element S7, an eighth switching element S8, a first capacitor C1 and a second capacitor C2. In the shift register unit according to the exemplary embodiment, the first switching element S1 is switched on in response to an input signal VIN so as to provide the input signal VIN to a first node N1; the second switching element S2 is switched on in response to a first clock signal CK1 so as to provide a first voltage VDD to the first node N1; the third switching element S3 is switched on in response to the first clock signal CK1 so as to provide the first voltage VDD to a second node N2; the fourth switching element S4 is switched on in response to a third clock signal CK3 so as to provide the input signal VIN to the second node N2; the fifth switching element S5 is switched on in response to a signal at the second node N2 so as to input the first voltage VDD to a third node N3; the sixth switching element S6 is switched on in response to the first clock signal CK1 so as to provide a second voltage VEE to the third node N3; a seventh switching element S7 is switched on in response to a signal at the third node N3 so as to provide the first voltage VDD to an output signal terminal VOUT; the eighth switching element S8 is switched on in response to a signal at the first node N1 so as to provide a second clock signal CK2 to the output signal terminal VOUT; the first capacitor C1 is coupled between the first voltage VDD and the second node N2; the second capacitor C2 is coupled between the first node N1 and the output signal terminal VOUT.

The first to eighth switching elements S1 to S8 may be transistors, for example, first to eight transistors T1 to T8. However, in other exemplary embodiments of the present disclosure, the first to eight switching elements S1 to S8 may be switching elements of other types, for example, bipolar junction transistors, thyristors, controllable diodes, and the like. The following descriptions will be made with an example where all of the first to eighth transistors T1 to T8 are P type transistors.

Figure 2:
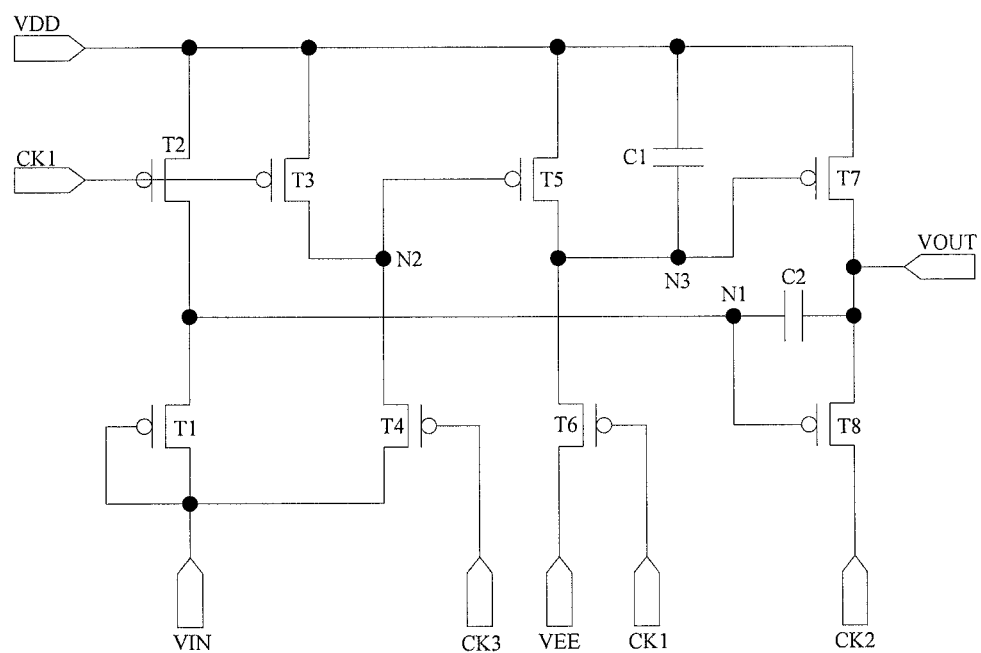
FIG. 2 is a schematic diagram showing a structure of another shift register unit according to an exemplary embodiment of the present disclosure.

Referring to FIG. 2, each of the first to eighth transistors T1 to T8 has a first terminal, a second terminal and a control terminal, which may be a source, a drain and a gate of each transistor, for example.

The control terminal and the first terminal of the first transistor T1 are coupled with the input signal VIN, and the second terminal of the first transistor T1 is coupled with the first node N1. When the input signal VIN is at a low level, the first transistor T1 is switched on, and the input signal VIN is input to the first node N1.

The control terminal of the second transistor T2 is coupled with the first clock signal CK1, the first terminal of the second third transistor is coupled with the first voltage VDD, the second terminal of the second transistor T2 is coupled with the first node N1. In the exemplary embodiment, the first voltage VDD is a high level. When the first clock signal CK1 is at a low level, the second transistor T2 is switched on, and the first voltage VDD is input to the first node N1.

The control terminal of the third transistor T3 is coupled with the first clock signal CK1, the first terminal of the third transistor is coupled with the first voltage VDD, and the second terminal of the third transistor T3 is coupled with the second node N2. When the first clock signal CK1 is at a low level, the third transistor T3 is switched on, and the first voltage VDD is input to the second node N2.

The control terminal of the fourth transistor T4 is coupled with the third clock signal CK3, the first terminal of the fourth transistor T4 is coupled with the input signal VIN, and the second terminal of the fourth transistor T4 is coupled with the second node N2. When the third clock signal CK3 is at a low level, the fourth transistor T4 is switched on, and the input signal VIN is input to the second node N2.

The control terminal of the fifth transistor T5 is coupled with the second node N2, the first terminal of the fifth transistor T5 is coupled with the first voltage VDD, and the second terminal of the fifth transistor T5 is coupled with the third node N3. When the voltage at the second node N2 is at a low level, the fifth transistor T5 is switched on, and the first voltage is input to the third node N3.

The control terminal of the sixth transistor T6 is coupled with the first clock signal CK1, the first terminal of the sixth transistor T6 is coupled with the second voltage VEE, and the second terminal of the sixth transistor T6 is coupled with the third node N3. In the exemplary embodiment, the second voltage VEE is a low level voltage. When the first clock signal CK1 is at a low level, the sixth transistor is switched on and the second voltage VEE is input to the third node N3.

The control of the seventh transistor T7 is coupled with the third node N3, the first terminal of the seventh transistor T7 is coupled with the first voltage VDD, and the second terminal of the seventh transistor T7 is coupled with the output signal terminal VOUT. When the voltage at the third node N3 is at a low level, the seventh transistor T7 is switched on, and the first voltage VDD is output from the output signal terminal VOUT. Because the first voltage VDD in the exemplary embodiment is a high level voltage, the potential at the third node N3 is a low level, and thus the shift register unit outputs a high level signal.

The control terminal of the eighth transistor T8 is coupled with the first node N1, the first terminal of the eighth transistor T8 is coupled with the second clock signal CK2, and the second terminal of the eighth transistor T8 is coupled with the output signal terminal VOUT. When the voltage at the first node N1 is at a low level, the eight transistor T8 is switched on, and the second clock signal CK2 is output from the output signal terminal VOUT. Thus, when the eighth transistor T8 is switched on, if the second clock signal CK2 is at a high level, the shift register unit outputs a high level signal; if the second clock signal CK2 is at a low level, the shift register unit outputs a low level signal.

A first terminal of the first capacitor C1 is coupled with the first voltage VDD, and a second terminal of the first capacitor C1 is coupled with the third node N3. The first capacitor C1 stores the voltage (energy) at the third node N3. A first terminal of the second capacitor C2 is coupled with the first node N1, and a second terminal of the second capacitor C2 is coupled with the output signal terminal VOUT. The second capacitor stores the voltage at the first node N1.

Figure 3:
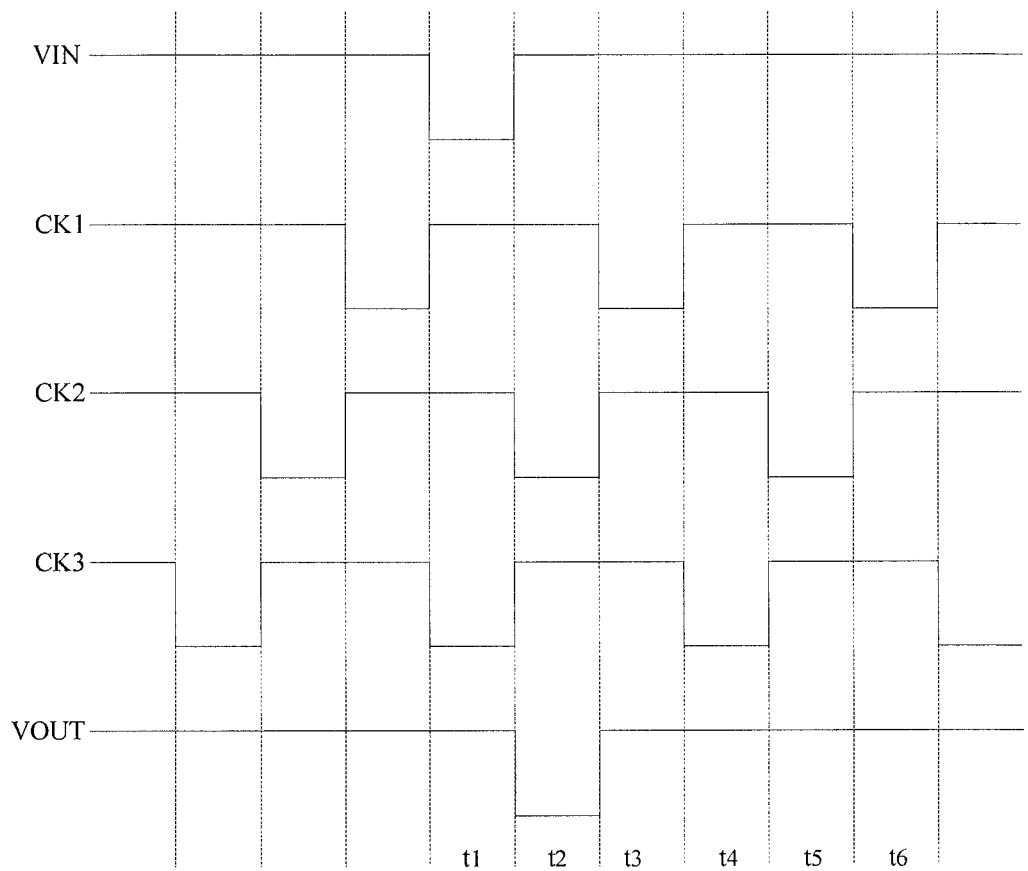
FIG. 3 shows driving sequence and signal waveforms for the shift register units in FIGS. 1 and 2.

The operating principle of the shift register unit according to an embodiment of the present disclosure will be described below with reference to the driving sequence in FIG. 3. Referring to FIG. 3, in the exemplary embodiment, the first clock signal CK1 is two thirds of a clock signal cycle ahead of the second clock signal CK2 in phase, and the second clock signal CK2 is two thirds of the clock signal cycle ahead of the third clock signal in phase. The first to third clock signals CK1 to CK3 have a duty cycle of 1:3 which is a ratio between duration of a low level and the period of each clock signal. The operation procedure of the shift register unit is as follows.

Figure 4:
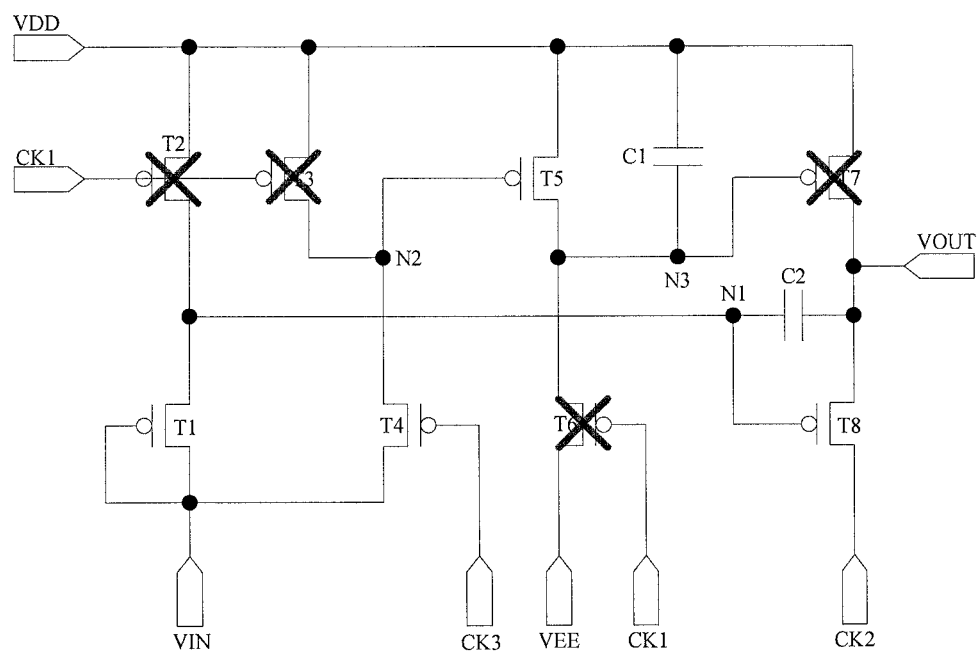
FIGS. 4 to 9 are equivalent circuit diagram of the shift register unit in FIG. 2 during time periods t1 to t6.

Referring to FIGS. 3 and 4, during the time period t1 (i.e., a charging stage), the first clock signal CK1 and the second clock signal CK2 are at a high level, and the input signal VIN and the third clock signal CK3 are at a low level. The second transistor T2, the third transistor T3, and the sixth transistor T6 are switched off, and the first transistor T1 and the fourth transistor T4 are switched on. The input signal VIN is input to the first node N1 via the first transistor T1 such that the second capacitor C2 is charged, and meanwhile the eighth transistor T8 is switched on. The input signal VIN is input to the second node N2 via the fourth transistor T4 such that the fifth transistor T5 is switched on. The first voltage VDD is input the third node N3 via the fifth transistor T5 such that the first capacitor C1 is charged, and meanwhile the seventh transistor T7 is switched off. The second clock signal CK2 is output from the single terminal VOUT via the eighth transistor T8. Because the second clock signal CK2 during this stage is at a high level, the output of the shift register unit is a high level signal.

Figure 5:
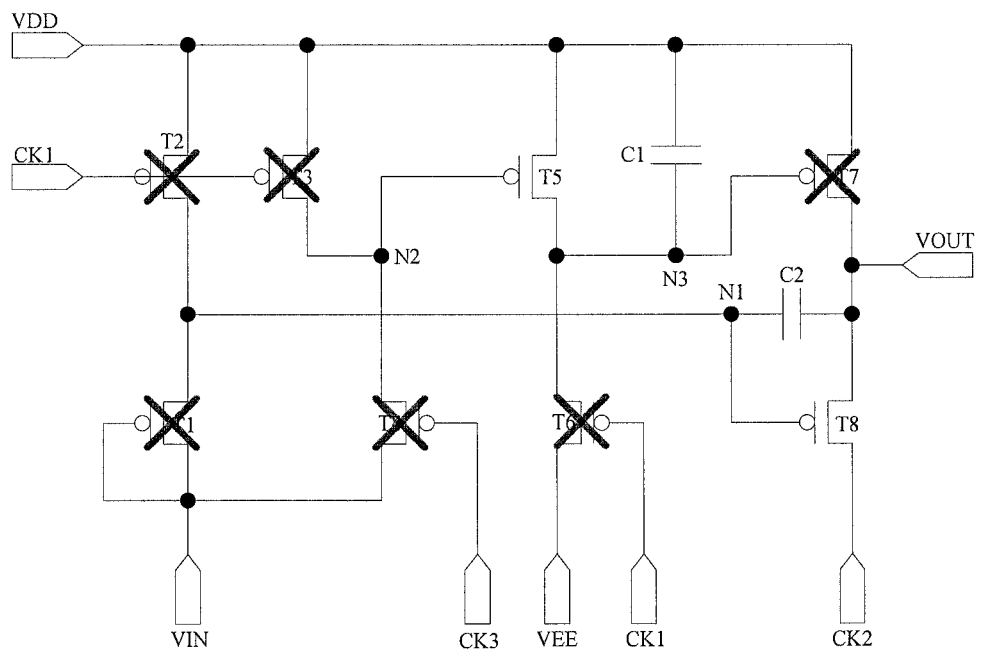

Referring to FIGS. 3 and 5, during a time period t2 (i.e., an output stage), the input signal VIN, the first clock signal CK1, and the third clock signal CK3 are at a high level, and the second clock signal CK2 is at a low level. The first transistor T1, the second transistor T2, the third transistor T3, the fourth transistor T4, and the sixth transistor T6 are switched off. Under the high level voltage which is stored in the first capacitor C1, the voltage at the third node N3 remains at a low level, and thus the seventh transistor T7 keeps switched off. Under the low level voltage which is stored in the second capacitor C2, the voltage at the first node N1 remains at a low level, and thus the eighth transistor T8 keeps switched on. The second clock signal CK2 is output from the output single terminal VOUT via the eighth transistor T8. Because the second clock signal CK2 during this stage is at a low level, the output of the shift register unit is a low level signal.

Figure 6:
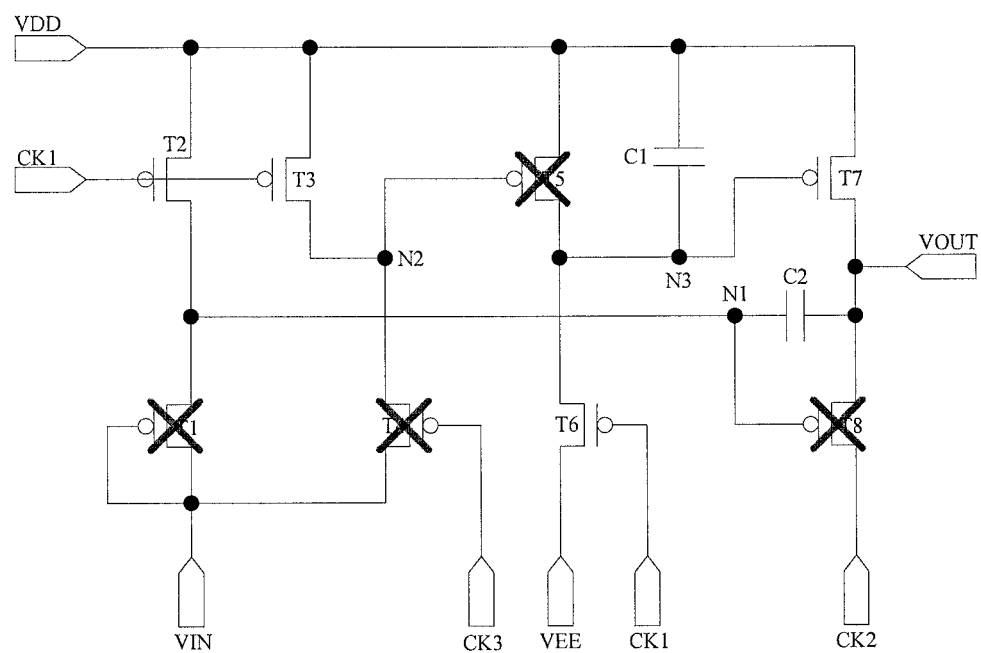
Figure 7:
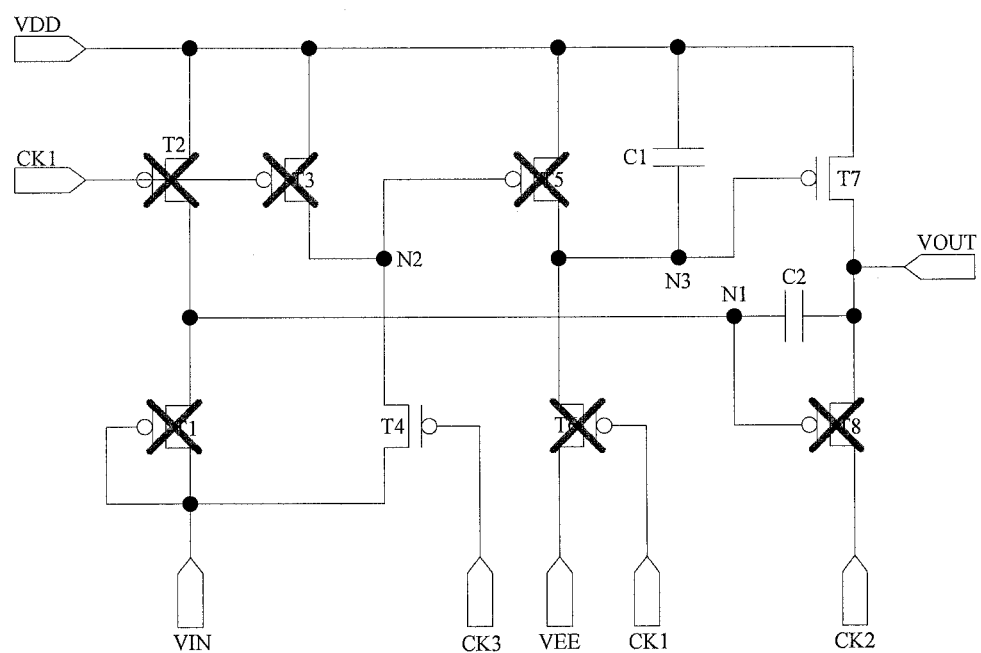
Figure 8:
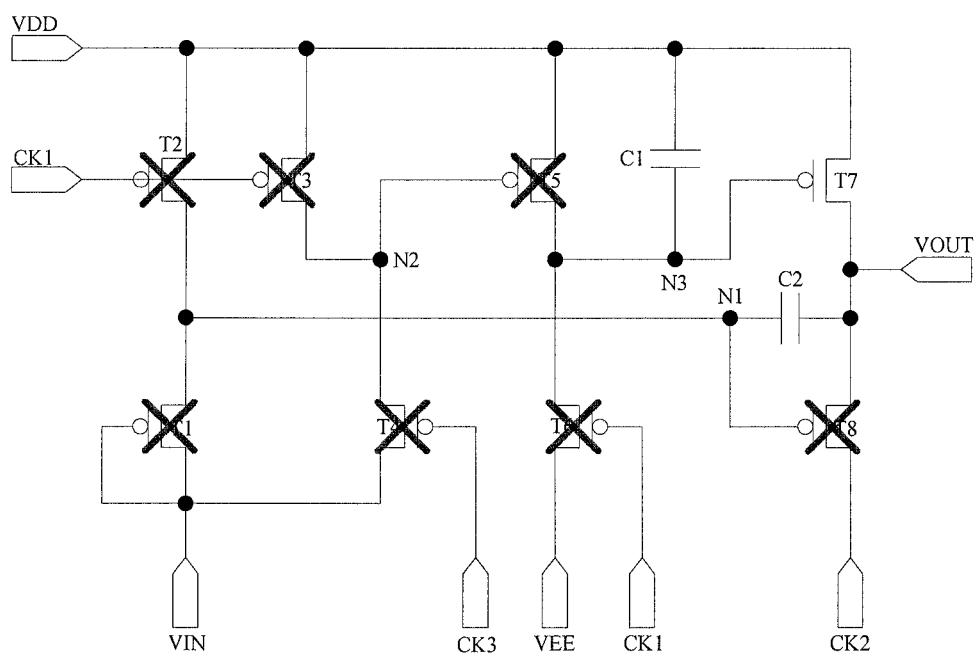
Figure 9:
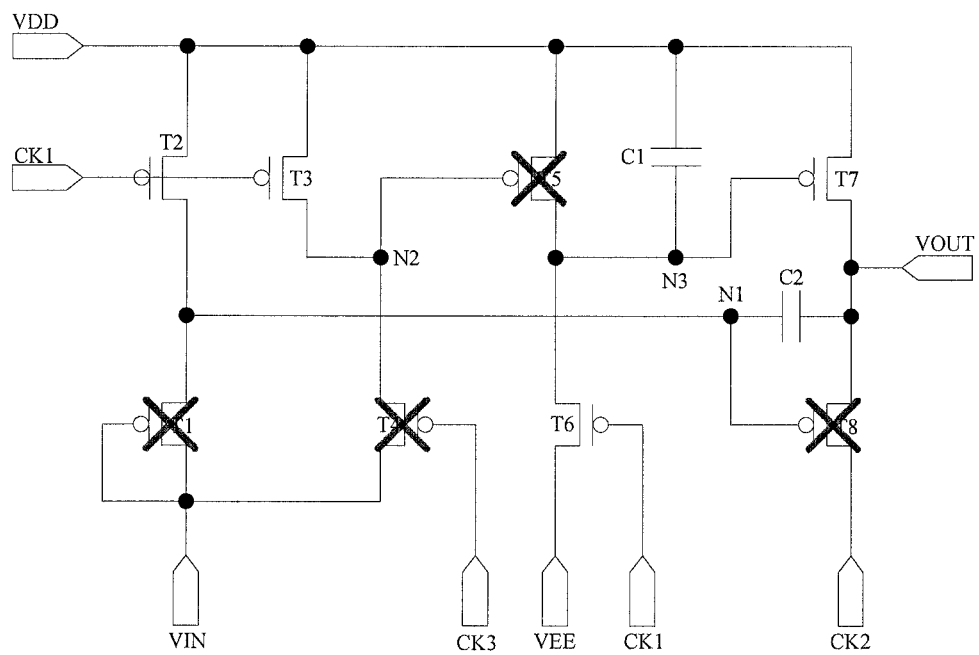

Referring to FIGS. 3 and 6, during a time period t3 (i.e., a reset stage), the input signal VIN, the second clock signal CK2 and the third clock signal CK3 are at a high level, and the first clock signal CK1 is at a low level. The first transistor T1 and the fourth transistor T4 are switched off, and the second transistor T2, the third transistor T3 and the fourth transistor T4 are switched on. The first voltage VDD is input to the first node N1 via the second transistor T2, such that the second capacitor C2 is charged to reset, and meanwhile the eighth transistor T8 is switched off. The first voltage VDD is input to the second node N2 via the third transistor T3, such that the fifth transistor T5 is switched off. The second voltage VEE is input to the third node N3 via the sixth transistor T6, such that the first capacitor C1 is charged to reset, and meanwhile the seventh transistor T7 is switched on. And, the first voltage VDD is output from the output signal terminal VOUT via the seventh transistor T7. Because the first voltage VDD is at a high level during this stage, the output of the shift register unit is a high level signal.

Referring to FIGS. 3, and 7-9, during the time periods t4 to t6 after the reset stage t3, under the low level voltage stored in the first capacitor C1, the voltage at the third node N3 remains at a low level, the seventh transistor T7 keeps switched on, the first voltage VDD is output from the output signal terminal VOUT via the seventh transistor T7. Because the first VDD during this stage is at a high level, the output of the shift register unit is a high level signal. In addition, when the first clock signal CK1 is at a low level, the sixth transistor T6 is switched on, the second voltage VEE is input to the third node N3 via the sixth transistor T6, such that the first capacitor C1 is charged, and thereby the seventh transistor T7 keeps switched on. Consequently, the output of the shift register unit can be guaranteed at a high level.

Another advantage of the pixel driver circuit in embodiments of the present disclosure is that the circuit employs transistors which have the same channel type, i.e., all the transistors are P type thin film transistors. Using the P type thin film transistors has the following advantages. For example, such driver circuit has a strong noise suppression capability. As another example, the P type thin film transistors are switched on upon a low level signal, and thus such configuration is relatively easy to implement in charge management. As another example, N type thin film transistors are inclined to be influenced by ground bounce, while the P type thin film transistors are only inclined to be influenced by the IR drop on the driving voltage lines which is relatively easy to be removed. As another example, the P type thin film transistors are easy to manufacture and thereby have a low price. Also, the P type thin film transistors have better reliability. Thus, using the P type thin film transistors to form shift register units can reduce the complexities and costs in manufacturing process, and can also improve produce quality. Optionally, one of ordinary skill in this art can appreciate that the shift register unit in the present disclosure may also be formed by N type transistors. For example, if all of the first to eighth transistors T1 to T8 are N type transistors, the first voltage VDD is low level voltage, the second voltage VEE is a high level voltage, the first to third clock signals CK1 to CK3 have a duty cycle of 1:3 which is a ratio between duration of a high level and the period of each clock signal. Rather, the present disclosure is not limited to the above described specific embodiments.

Figure 10:
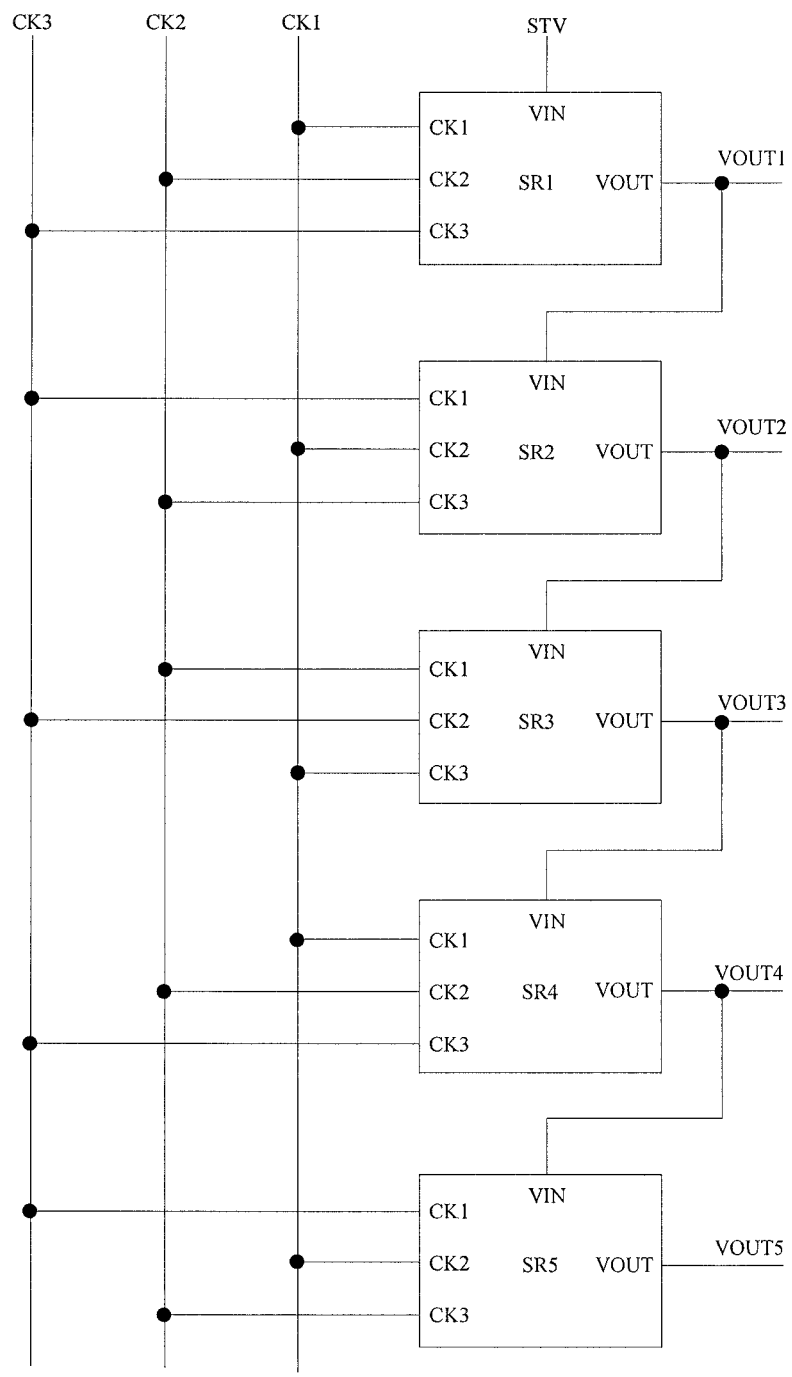
FIG. 10 is a schematic diagram for implementing a gate driver circuit according to an exemplary embodiment of the present disclosure.

Further, exemplary embodiments of the present disclosure provide a gate driver circuit which includes any one of the shift register units as described above. FIG. 10 shows a gate driver circuit according to an exemplary embodiment of the present disclosure. As shown in FIG. 10, the gate driver circuit includes a plurality of shift register units, such as a first shift register unit SR1, a second shift register SR2, a third shift register SR3, a fourth shift register SR4, and a fifth shift register SR5. Except the last stage of shift register unit, an input signal terminal VIN of each stage of shift register unit is coupled with an output signal terminal VOUT of a next stage of shift register unit; except the last stage of shift register unit, an output signal terminal VOUT of each stage of shift register unit is coupled with an input signal terminal VIN of a next stage of shift register unit. An input signal terminal VIN of the first stage of shift register unit is input with a starting signal. As shown in FIG. 10, an output signal terminal VOUT of the first shift register unit SR1 is coupled with an input signal terminal VIN of the second shift register unit SR2, an output signal terminal VOUT of the second shift register unit SR2 is coupled with an input signal terminal VIN of the third shift register unit SR3, an output signal terminal VOUT of the third shift register unit SR3 is coupled with an input signal terminal VIN of the fourth shift register unit SR4, and an output signal terminal VOUT of the fourth shift register unit SR4 is coupled with an input signal terminal VIN of a nest stage of shift register unit.

Referring to FIG. 10 again, in an exemplary embodiment of the present disclosure, the gate driver circuit includes a clock signal generation unit (not shown) which generates a first clock signal CK1, a second clock signal CK2 and a third clock signal CK3, and there is a phase difference of two thirds of a signal cycle among the three clock signals. For example, the first clock signal CK1 is two thirds of a clock signal cycle ahead of the second clock signal CK2 in phase, and the second clock signal CK2 is two thirds of the clock signal cycle ahead of the third clock signal CK3 in phase.

A first to third clock signals input to the first shift register unit SR1 are the first to third clock signals CK1 to CK3 generated by the clock generation unit, respectively. A first to third clock signals input to the second shift register unit SR2 are the third clock signal CK3, the first clock signal C21 and the second clock signal CK2 generated by the clock generation unit, respectively. A first to third clock signals input to the third shift register unit SR3 are the second clock signal CK2, the third clock signal CK3 and the first clock signal CK1 generated by the clock generation unit, respectively.

As compared with conventional technologies, the gate driver circuit in the present disclosure only needs three clock signals, and thus the number of the control signals is reduced. Also, the gate driver circuit can reduce the number of the wirings for the control signals, which is benefit for realizing display panels with narrower bezel.

Figure 11:
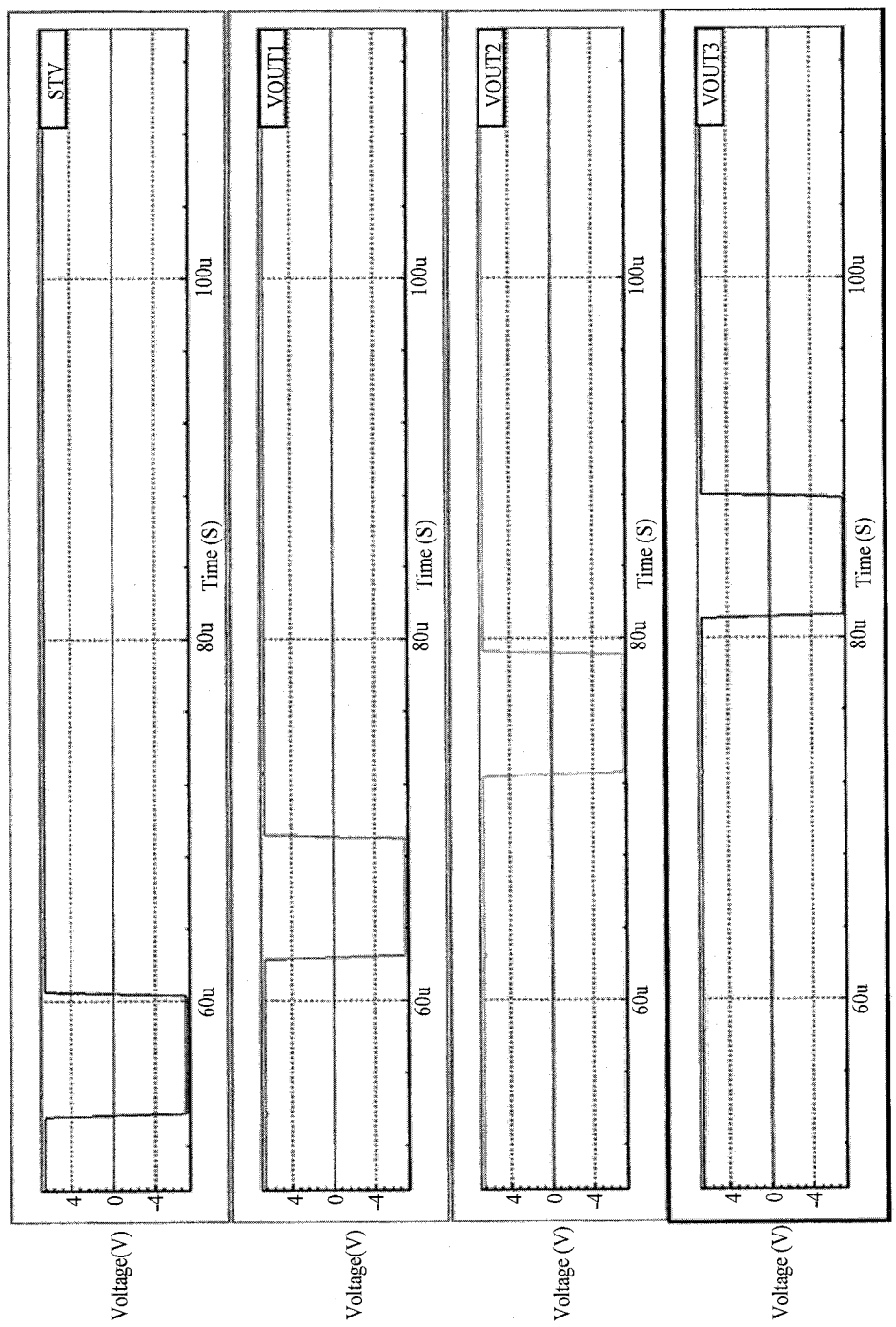
FIG. 11 shows output signals of the gate driver circuit in FIG. 10.

Also, the inventor(s) has conducted experiments to verify the technical effects of the gate driver circuit provided by exemplary embodiments of the present disclosure. As shown in FIG. 11, the waveforms of the output signals of the gate driver circuit in the exemplary embodiments are effective and correct, and the performance of the gate driver circuit is not compromised.

Exemplary embodiments of the present disclosure further provide a display panel, including any one of the gate driver circuits as mentioned above. Because the gate driver circuit needs reduced wiring area, the effective display area of the display panel can be increased, which is benefit for improving the resolution of the display panel. Also, the bezel of the display panel can be further narrowed.

In view of the above, in the exemplary embodiments as disclosed herein, a shift register unit is composed of a relatively small number of transistors and capacitors and reduced number of clock signals are required by the gate driver circuit including the shift register unit, and thus the wiring areas occupied by the shift register unit and the gate driver circuit composed of a plurality of the shift register units can be reduced, thereby providing technical support for designing display panels with higher resolution and narrower bezel. Meanwhile, because the shift register unit and the gate driver circuit have a relatively simple structure, the manufacturing processes can be simplified and thereby costs can be reduced.

The above detailed descriptions relate to some possible implementations of the present disclosure, and however they are not for limiting the protection scope of the present disclosure, and any equivalent implementations or modifications without departing the spirit of the present disclosure shall fall within the protection scope of the present disclosure.

What is claimed is:

1. A shift register unit, comprising:
   a first switching element that is switched on in response to an input signal so as to provide the input signal to a first node;
   a second switching element that is switched on in response to a first clock signal so as to provide a first voltage to the first node;
   a third switching element that is switched on in response to the first clock signal so as to provide the first voltage to a second node;
   a fourth switching element that is switched on in response to a third clock signal so as to provide the input signal to the second node;
   a fifth switching element that is switched on in response to a signal at the second node so as to input the first voltage to a third node;
   a sixth switching element that is switched on in response to the first clock signal so as to provide a second voltage to the third node;
   a seventh switching element that is switched on in response to a signal at the third node so as to provide the first voltage to an output signal terminal;
   an eighth switching element that is switched on in response to a signal at the first node so as to provide a second clock signal to the output signal terminal;
   a first capacitor coupled between the first voltage and the third node; and
   a second capacitor coupled between the first node and the output signal terminal.

2. The shift register unit according to claim 1, wherein the first to eighth switching elements are first to eight transistors, respectively.

3. The shift register unit according to claim 2, wherein each of the first to eighth transistors has a first terminal, a second terminal and a control terminal;
   the control terminal and the first terminal of the first transistor are coupled with the input signal, and the second terminal of the first transistor is coupled with the first node;
   the control terminals of the second and third transistors are coupled with the first clock signal, the first terminals of the second and third transistors are coupled with the first voltage, the second terminal of the second transistor is coupled with the first node, and the second terminal of the third transistor is coupled with the second node;
   the control terminal of the fourth transistor is coupled with the third clock signal, the first terminal of the fourth transistor is coupled with the input signal, and the second terminal of the fourth transistor is coupled with the second node;
   the control terminal of the fifth transistor is coupled with the second node, the first terminal of the fifth transistor is coupled with the first voltage, and the second terminal of the fifth transistor is coupled with the third node;
   the control terminal of the sixth transistor is coupled with the first clock signal, the first terminal of the sixth transistor is coupled with the second voltage, and the second terminal of the sixth transistor is coupled with the third node;
   the control of the seventh transistor is coupled with the third node, the first terminal of the seventh transistor is coupled with the first voltage, and the second terminal of the seventh transistor is coupled with the output signal terminal; and
   the control terminal of the eighth transistor is coupled with the first node, the first terminal of the eight transistor is coupled with the second clock signal, and the second terminal of the eighth transistor is coupled with the output signal terminal.

4. The shift register unit according to claim 3, wherein the first to eighth transistors are N type transistors.

5. The shift register unit according to claim 3, wherein the first to eighth transistors are P type transistors.

6. The shift register unit according to claim 5, wherein the first clock signal is two thirds of a clock signal cycle ahead of the second clock signal in phase, and the second clock signal is two thirds of the clock signal cycle ahead of the third clock signal in phase.

7. The shift register unit according to claim 6, wherein the first to third clock signals have a duty cycle of 1:3 which is a ratio between duration of a low level and the period of each clock signal.

8. The shift register unit according to claim 5, wherein the first voltage is a high level voltage, and the second voltage is a low level voltage.

9. A gate driver circuit, comprising a plurality of shift register units, each of which comprises:
- a first switching element that is switched on in response to an input signal so as to provide the input signal to a first node;
- a second switching element that is switched on in response to a first clock signal so as to provide a first voltage to the first node;
- a third switching element that is switched on in response to the first clock signal so as to provide the first voltage to a second node;
- a fourth switching element that is switched on in response to a third clock signal so as to provide the input signal to the second node;
- a fifth switching element that is switched on in response to a signal at the second node so as to input the first voltage to a third node;
- a sixth switching element that is switched on in response to the first clock signal so as to provide a second voltage to the third node;
- a seventh switching element that is switched on in response to a signal at the third node so as to provide the first voltage to an output signal terminal;
- an eighth switching element that is switched on in response to a signal at the first node so as to provide a second clock signal to the output signal terminal;
- a first capacitor coupled between the first voltage and the third node; and
- a second capacitor coupled between the first node and the output signal terminal.

10. The gate driver circuit according to claim 9, wherein the plurality of shift register units are cascaded; except the last stage of shift register unit, an output signal of each stage of shift register unit is coupled with an input signal terminal of a next stage of shift register unit, and an input signal of the first stage of shift register is input with a starting signal.

11. The gate driver circuit according to claim 10, wherein the plurality of shift register units which are cascaded comprise at least a first shift register unit, a second shift register unit and a third shift register unit;
- an output signal terminal of the first shift register unit is coupled with an input signal terminal of the second shift register unit; and
- an output signal terminal of the second shift register unit is coupled with an input signal terminal of the third shift register unit.

12. The gate driver circuit according to claim 11, further comprising:
- a clock signal generation unit generating a first clock signal, a second clock signal and a third clock signal, wherein the first clock signal is two thirds of a clock signal cycle ahead of the second clock signal in phase, and the second clock signal is two thirds of the clock signal cycle ahead of the third clock signal in phase;
- a first to third clock signals input to the first shift register unit are the first to third clock signals generated by the clock generation unit, respectively;
- a first to third clock signals input to the second shift register unit are the third clock signal, the first clock signal and the second clock signal generated by the clock generation unit, respectively;
- a first to third clock signals input to the third shift register unit are the second clock signal, the third clock signal and the first clock signal generated by the clock generation unit, respectively.

13. The gate driver circuit according to claim 9, wherein the first to eighth switching elements are first to eight transistors, respectively.

14. The gate driver circuit according to claim 13, wherein each of the first to eighth transistors has a first terminal, a second terminal and a control terminal;
- the control terminal and the first terminal of the first transistor are coupled with the input signal, and the second terminal of the first transistor is coupled with the first node;
- the control terminals of the second and third transistors are coupled with the first clock signal, the first terminals of the second and third transistors are coupled with the first voltage, the second terminal of the second transistor is coupled with the first node, and the second terminal of the third transistor is coupled with the second node;
- the control terminal of the fourth transistor is coupled with the third clock signal, the first terminal of the fourth transistor is coupled with the input signal, and the second terminal of the fourth transistor is coupled with the second node;
- the control terminal of the fifth transistor is coupled with the second node, the first terminal of the fifth transistor is coupled with the first voltage, and the second terminal of the fifth transistor is coupled with the third node;
- the control terminal of the sixth transistor is coupled with the first clock signal, the first terminal of the sixth transistor is coupled with the second voltage, and the second terminal of the sixth transistor is coupled with the third node;
- the control of the seventh transistor is coupled with the third node, the first terminal of the seventh transistor is coupled with the first voltage, and the second terminal of the seventh transistor is coupled with the output signal terminal; and
- the control terminal of the eighth transistor is coupled with the first node, the first terminal of the eight transistor is coupled with the second clock signal, and the second terminal of the eighth transistor is coupled with the output signal terminal.

15. The gate driver circuit according to claim 14, wherein the first to eighth transistors are P type transistors.

16. The gate driver circuit according to claim 15, wherein the first clock signal is two thirds of a clock signal cycle ahead of the second clock signal in phase, and the second clock signal is two thirds of the clock signal cycle ahead of the third clock signal in phase.

17. The gate driver circuit according to claim 16, wherein the first to third clock signals have a duty cycle of 1:3 which is a ratio between duration of a low level and the period of each clock signal.

18. The gate driver circuit according to claim 15, wherein the first voltage is a high level voltage, and the second voltage is a low level voltage.

19. A display panel, comprising:
- a pixel array composed of pixels arranged in rows and columns;
- a plurality of scan lines connected with the pixels;
- a gate driver circuit providing on/off control signals to the scan lines to control on and off of the scan lines;
- wherein the gate driver comprises a plurality of shift register units, each of which comprises:
- a first switching element that is switched on in response to an input signal so as to provide the input signal to a first node;

a second switching element that is switched on in response to a first clock signal so as to provide a first voltage to the first node;

a third switching element that is switched on in response to the first clock signal so as to provide the first voltage to a second node;

a fourth switching element that is switched on in response to a third clock signal so as to provide the input signal to the second node;

a fifth switching element that is switched on in response to a signal at the second node so as to input the first voltage to a third node;

a sixth switching element that is switched on in response to the first clock signal so as to provide a second voltage to the third node;

a seventh switching element that is switched on in response to a signal at the third node so as to provide the first voltage to an output signal terminal;

an eighth switching element that is switched on in response to a signal at the first node so as to provide a second clock signal to the output signal terminal;

a first capacitor coupled between the first voltage and the third node; and a second capacitor coupled between the first node and the output signal terminal.

20. The display panel according to claim 19, wherein the first to eighth switching elements are first to eight transistors, respectively.

* * * * *